United States Patent
Ikegami et al.

(10) Patent No.: US 9,858,976 B2
(45) Date of Patent: Jan. 2, 2018

(54) NONVOLATILE RAM COMPRISING A WRITE CIRCUIT AND A READ CIRCUIT OPERATING IN PARALLEL

(71) Applicant: Kabushiki Kaisha Toshiba, Minato-ku (JP)

(72) Inventors: Kazutaka Ikegami, Inagi (JP); Hiroki Noguchi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/266,327

(22) Filed: Sep. 15, 2016

(65) Prior Publication Data
US 2017/0270988 A1    Sep. 21, 2017

(30) Foreign Application Priority Data
Mar. 16, 2016   (JP) .................................. 2016-052297

(51) Int. Cl.
*G11C 7/00*  (2006.01)
*G11C 11/16*  (2006.01)
*G11C 15/02*  (2006.01)

(52) U.S. Cl.
CPC ...... *G11C 11/1675* (2013.01); *G11C 11/1655* (2013.01); *G11C 11/1657* (2013.01); *G11C 11/1673* (2013.01); *G11C 15/02* (2013.01)

(58) Field of Classification Search
CPC ... G11C 11/1675; G11C 7/22; G11C 11/1673; G11C 8/18; G11C 2207/2209
See application file for complete search history.

(56) References Cited

U.S. PATENT DOCUMENTS

| | | | |
|---|---|---|---|
| 5,036,491 A | 7/1991 | Yamaguchi | |
| 6,181,634 B1* | 1/2001 | Okita | G11C 7/1045 |
| | | | 365/189.04 |
| 2006/0145193 A1* | 7/2006 | So | G11C 8/10 |
| | | | 257/208 |
| 2011/0228594 A1 | 9/2011 | Rao et al. | |
| 2011/0228595 A1 | 9/2011 | Rao et al. | |
| 2013/0250686 A1* | 9/2013 | Marukame | G11C 16/08 |
| | | | 365/185.12 |
| 2014/0098613 A1 | 4/2014 | Kim | |
| 2016/0247567 A1 | 8/2016 | Ikegami et al. | |

FOREIGN PATENT DOCUMENTS

| | | |
|---|---|---|
| JP | 1-178193 A | 7/1989 |
| JP | 2001-135083 A | 5/2001 |
| JP | 2010-55674 A | 3/2010 |
| JP | 2012-22726 A | 2/2012 |
| JP | 2013-127829 A | 6/2013 |
| JP | 2013-527949 A | 7/2013 |
| JP | 2013-528887 A | 7/2013 |
| JP | 2016-157501 A | 9/2016 |
| WO | WO 2011/161798 A1 | 12/2011 |

* cited by examiner

*Primary Examiner* — Kretelia Graham
(74) *Attorney, Agent, or Firm* — Oblon, McClelland, Maier & Neustadt, L.L.P.

(57) ABSTRACT

According to one embodiment, a nonvolatile RAM includes a memory cell array, a first circuit being allowed to access the memory cell array in a write operation using a first pulse, and a second circuit being allowed to access the memory cell array in a read operation using a second pulse, the second circuit being allowed to operate in parallel with an operation of the first circuit. A width of the first pulse is longer than a width of the second pulse.

19 Claims, 13 Drawing Sheets

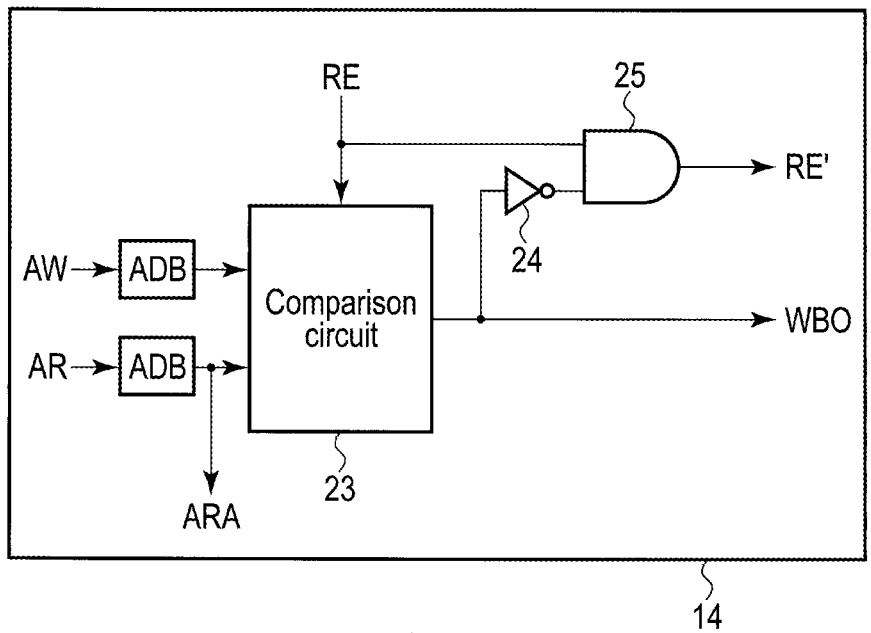
F I G. 7
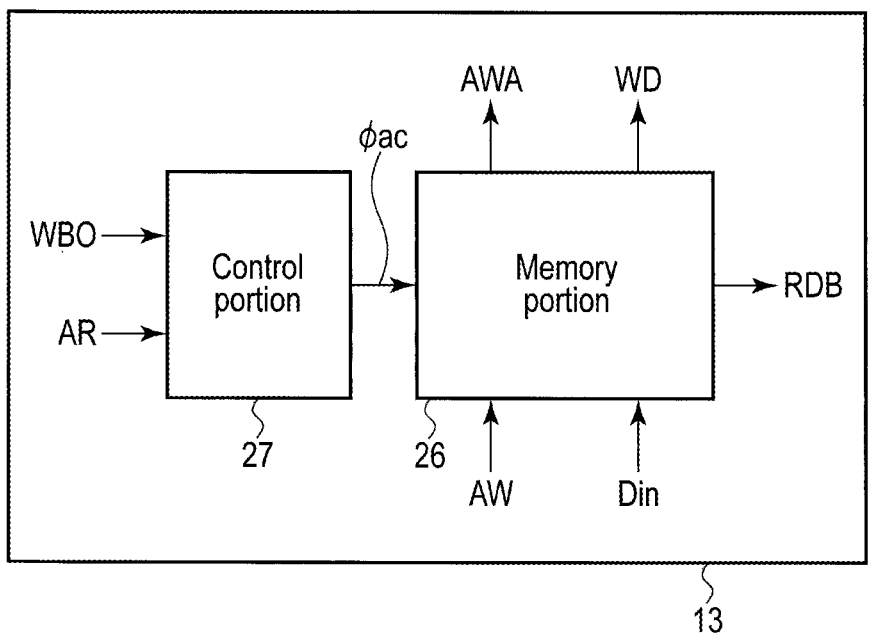
F I G. 8

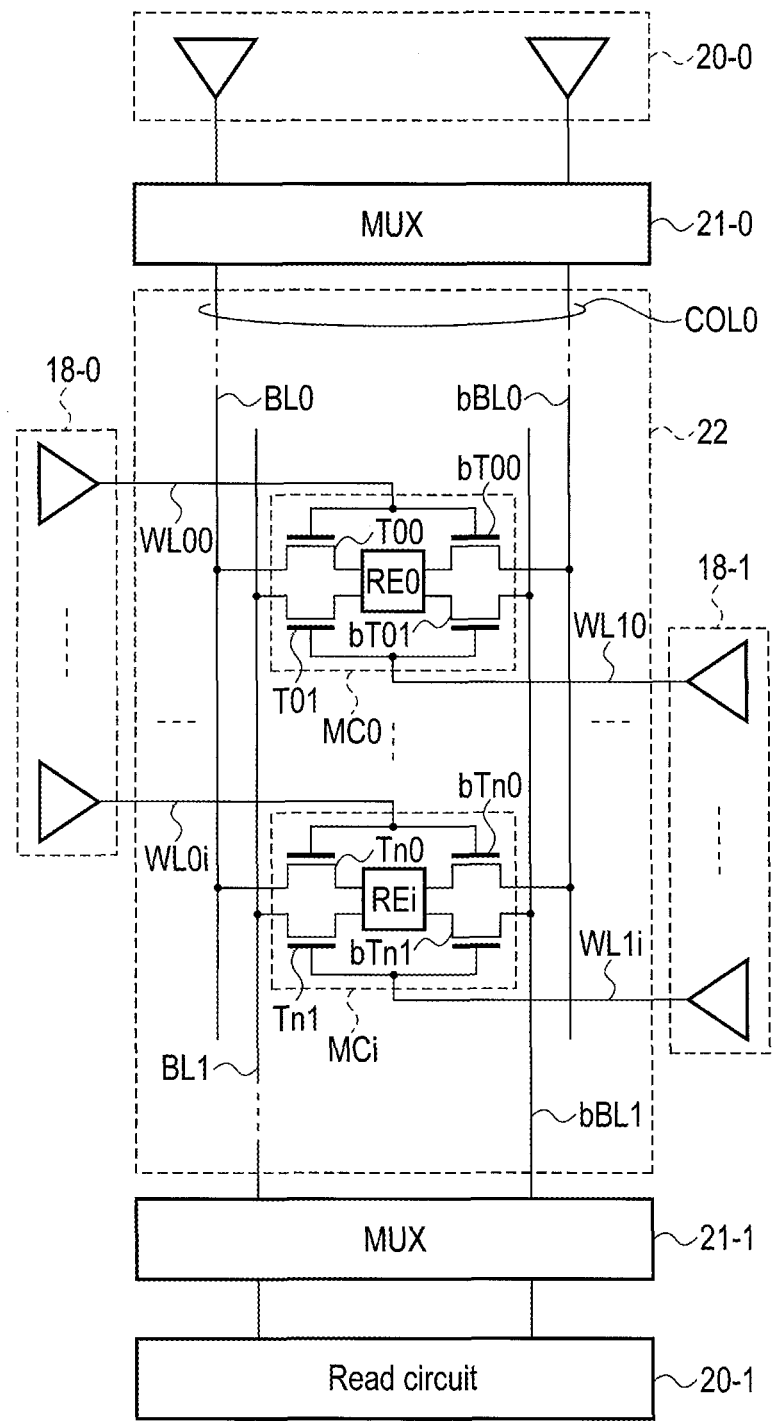
F I G. 11

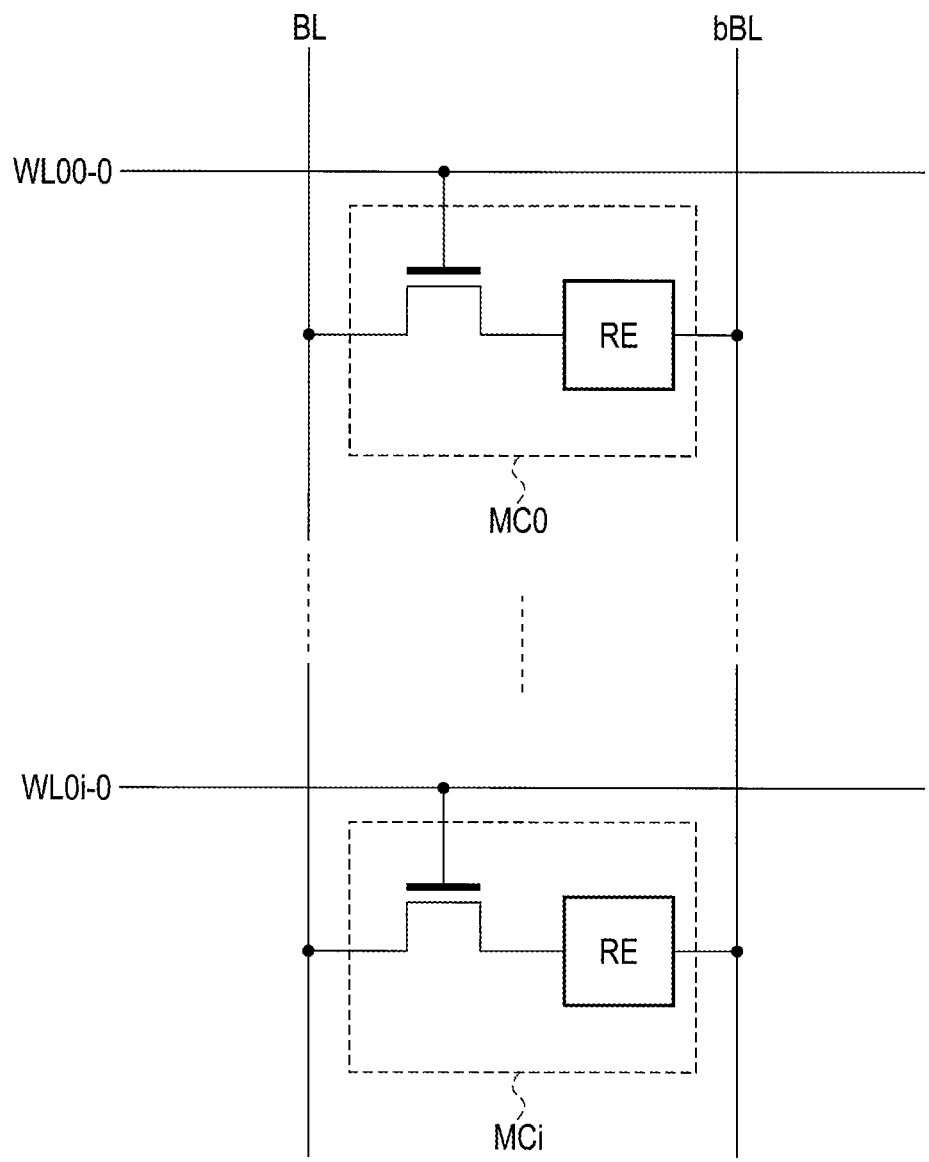
F I G. 16

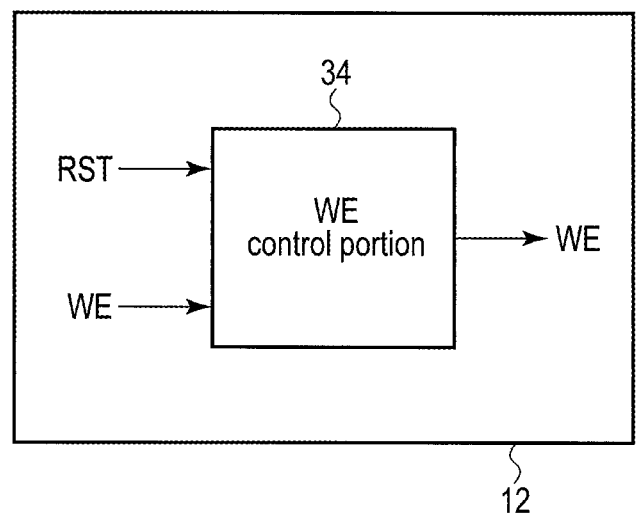
F I G. 18
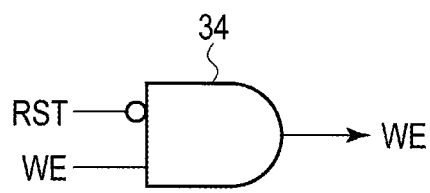
F I G. 19

NONVOLATILE RAM COMPRISING A WRITE CIRCUIT AND A READ CIRCUIT OPERATING IN PARALLEL

CROSS-REFERENCE TO RELATED APPLICATIONS

This application is based upon and claims the benefit of priority from Japanese Patent Application No. 2016-052297, filed Mar. 16, 2016, the entire contents of which are incorporated herein by reference.

FIELD

Embodiments described herein relate generally to a nonvolatile RAM.

BACKGROUND

The performance of processors can be improved by, for example, increasing the memory capacity of cache memories. In general, volatile RAMs such as static random access memories (SRAMs) are used as the cache memories. Thus, if the memory capacity of the cache memories is increased, power consumption by systems will increase. Accordingly, the use of nonvolatile RAMs such as magnetic random access memories (MRAMs) instead of volatile RAMs is being considered.

BRIEF DESCRIPTION OF THE DRAWINGS

FIG. 7 shows an example of an address processing portion.
FIG. 8 shows an example of a write buffer.
FIG. 11 shows an example of a memory cell array.
FIG. 16 shows an example of memory cells.
FIG. 18 shows an example of a command processing portion.
FIG. 19 shows an example of a WE control portion in the command processing portion.

DETAILED DESCRIPTION

In general, according to one embodiment, a nonvolatile RAM comprises: a memory cell array; a first circuit being allowed to access the memory cell array in a write operation using a first pulse; and a second circuit being allowed to access the memory cell array in a read operation using a second pulse, the second circuit being allowed to operate in parallel with an operation of the first circuit. A width of the first pulse is longer than a width of the second pulse.

Embodiments will be hereinafter described with reference to the accompanying drawings.

Embodiment

Figure 1:
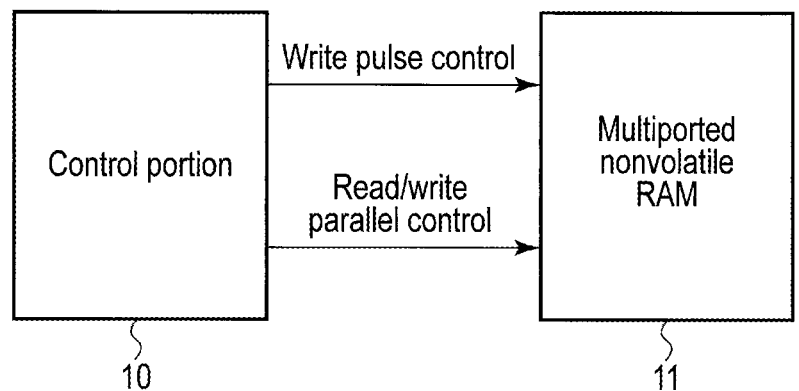
FIG. 1 shows an example of a system.

FIG. 1 shows an example of a system.

A system to which the present embodiment is applied comprises a control portion 10 and a nonvolatile RAM 11 controlled by the control portion 10. The control portion 10 is, for example, a host or a controller. The control portion 10 and the nonvolatile RAM 11 may be chips independent of each other, or may be included in a single chip such as a processor. The nonvolatile RAM 11 is a multiport nonvolatile RAM, for example, a multiport MRAM. Being multiport means comprising a read port and a write port, that is, being capable of executing a read and a write in parallel.

Figure 2:
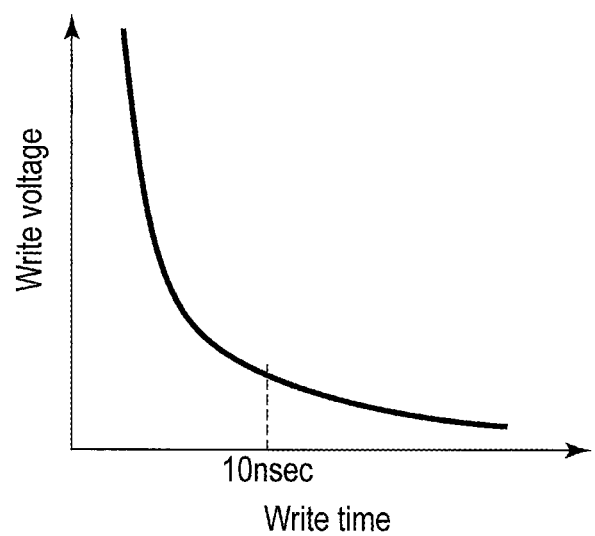
FIG. 2 shows a relationship between a write time and a write voltage.

In the write to the nonvolatile RAM 11, for example, as shown in FIG. 2, the write voltage is greater as the write time is shorter, that is, as writing is speeded up. In particular, in an area where the write time is shorter than or equal to 10 ns, the write voltage increases sharply as the write time is shorter.

Figure 3:
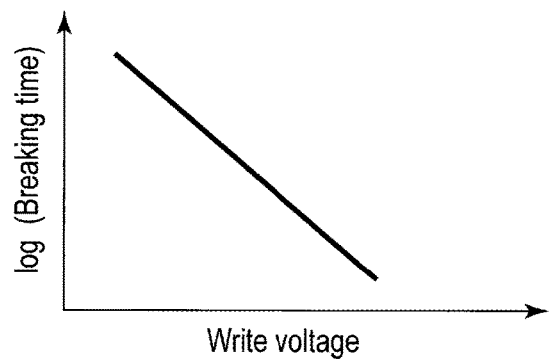
FIG. 3 shows a relationship between the write voltage and a breaking time.

In addition, an increase in the write voltage worsens an endurance of the nonvolatile RAM 11. For example, as shown in FIG. 3, because of an increase in the write voltage, memory elements, for example, magnetoresistive elements in the case of an MRAM, deteriorate rapidly, and the life (breaking time) of the memory elements becomes shorter exponentially.

However, for example, if the nonvolatile RAM 11 is used as a cache memory, and priority is given to speeded up writing equivalent to that of a conventional cache memory, for example, an SRAM, the write voltage cannot be decreased. In this case, the endurance of the nonvolatile RAM 11 deteriorates as described above. On the other hand, the access frequency of the cache memory is extremely high as compared to those of a main memory, a storage memory, etc. Thus, memory elements easily deteriorate. Therefore, if priority is given to the endurance and the write voltage is decreased, the write time becomes longer. In addition, while a write is being executed, a read is restricted.

In this manner, in the nonvolatile RAM 11, there is a trade-off between a speedup and an improvement of the endurance.

Therefore, the present embodiment proposes a technique of achieving a speedup and an improvement of the endurance of the nonvolatile RAM 11 at the same time.

First, the control portion 10 exercises write pulse control in accordance with the situation in which the system is used (the characteristics which the nonvolatile RAM 11 is required to have). In addition, the nonvolatile RAM 11 comprises a write circuit capable of generating write pulses (write voltages). The write circuit selects one of the write pulses under the write pulse control of the control portion 10.

For example, the control portion 10 commands the nonvolatile RAM 11 to execute a write using a write pulse with a high write voltage and a short pulse width, if it determines that it is a situation where priority is given to a speedup. On the other hand, the control portion 10 commands the nonvolatile RAM 11 to execute a write using a write pulse with a low write voltage and a long pulse width, if it determines that it is a situation where priority is given to an improvement of the endurance.

Accordingly, in the situation where priority is given to a speedup, speeded up writing can be achieved. On the other hand, in the situation where priority is given to an improvement of the endurance, an improvement of the endurance can be achieved.

Next, the control portion 10 executes read/write parallel control. Moreover, the nonvolatile RAM 11 comprises a multiport, that is, a read port and a write port so that a read and a write can be executed in parallel.

In this case, even if priority is given to an improvement of the endurance, and a write is executed using a write pulse with a low write voltage and a long pulse width, a read is not restricted while the write is being executed. Similarly, also if priority is given to a speedup and a write is executed using a write pulse with a high write voltage and a short pulse width, a read is not restricted.

In this manner, a speedup can be achieved by executing a read and a write in parallel. Especially, if a write pulse with a low write voltage and a long pulse width is selected, a speedup and an improvement of the endurance can be achieved at the same time.

(Block Diagram)

Figure 4:
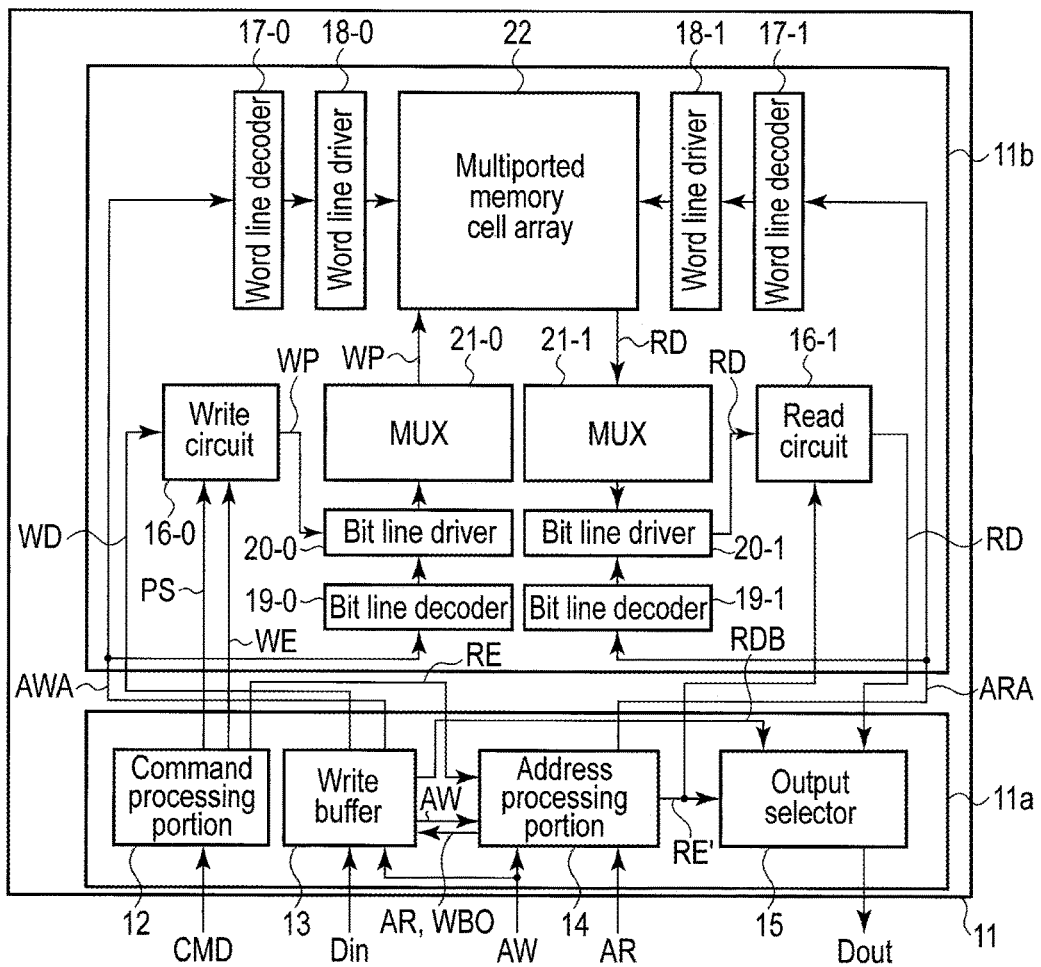
FIG. 4 shows an example of a nonvolatile RAM.

FIG. 4 shows an example of a nonvolatile RAM.

The nonvolatile RAM 11 is a multiported memory. The nonvolatile RAM 11 comprises an interface portion 11a and a memory cell array portion 11b.

The interface portion 11a comprises, for example, a command processing portion 12, a write buffer 13, an address processing portion 14, and an output selector 15.

The memory cell array portion 11b comprises, for example, a write circuit 16-0, a read circuit 16-1, and a multiport memory cell array 22. In addition, the memory cell array portion 11b comprises a first access circuit which accesses a memory cell in the memory cell array 22 at the time of writing, and a second access circuit which accesses a memory cell in the memory cell array 22 at the time of reading, to enable a read and a write to be executed in parallel, that is, to allow parallel access.

The first access circuit comprises a word line decoder 17-0, a word line driver 18-0, a bit line decoder 19-0, a bit line driver 20-0, and a multiplexer (MUX) 21-0. The second access circuit comprises a word line decoder 17-1, a word line driver 18-1, a bit line decoder 19-1, a bit line driver 20-1, and a multiplexer (MUX) 21-1.

The command processing portion 12 receives a command CMD to execute a write, a read, etc. For example, the command processing portion 12 outputs a write enable signal WE upon receipt of a write command, and outputs a read enable signal RE upon receipt of a read command. In addition, the command processing portion 12 outputs a pulse select signal PS upon receipt of a command to select a write pulse.

The command to select a write pulse is, for example, supplied from the control portion 10 of FIG. 1 as the write pulse control. The write enable signal WE and the pulse select signal PS are input to the write circuit 16-0.

The write circuit 16-0 is capable of generating writes pulses (write voltages). The write circuit 16-0 selects one of the write pulses on the basis of the pulse select signal PS. For example, as shown in FIG. 5, if the write circuit 16-0 is capable of generating two write pulses WP0 and WP1, the write circuit 16-0 selects one of the two write pulses WP0 and WP1 on the basis of the pulse select signal PS.

Figure 5:
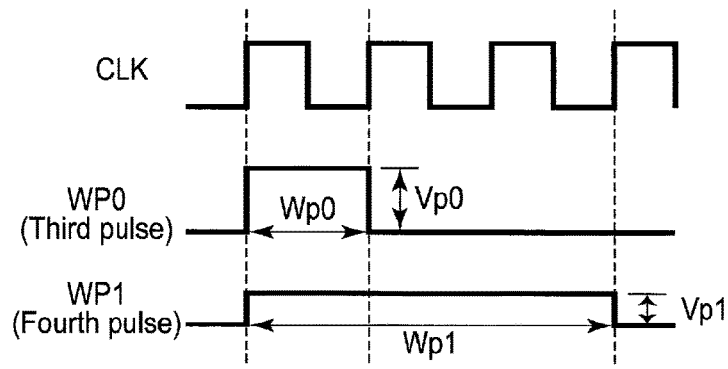
FIG. 5 shows an example of write pulses.

Here, for example, as shown in FIG. 5, the two write pulses WP0 and WP1 are both generated on the basis of a clock CLK. The write pulse WP0 has a write voltage Vp0 and a pulse width Wp0. The pulse width Wp0 corresponds to one cycle of the clock CLK. The write pulse WP0 is used in a situation where priority is given to a speedup.

In addition, the write pulse WP1 has a write voltage Vp1 and a pulse width Wp1. The write voltage Vp1 is lower than the write voltage Vp0. The pulse width Wp1 is longer than the pulse width Wp0. The pulse width Wp1 corresponds to three cycles of the clock CLK. The write pulse WP1 is used in a situation where priority is given to an improvement of the endurance.

A selected write pulse WP is supplied to the bit line driver 20-0. The bit line driver 20-0 supplies the write pulse WP to the memory cell array 22 in a direction according to the value of write data WD.

If the pulse width of the write pulse WP is variable, for example, a write cycle (write time) is lengthened by selecting the write pulse WP1 having the long pulse width Wp1 to improve the endurance. In this case, the problem is a stall phenomenon in which a read command cannot be received while a write is being executed, as compared to the case where the pulse width of the write pulse WP is fixed.

Moreover, even if the pulse width of the write pulse WP is fixed (one type), a write cycle is usually longer than a read cycle. Also in this case, the problem is a stall phenomenon in which a read command cannot be received while a write is being executed.

Figure 6:
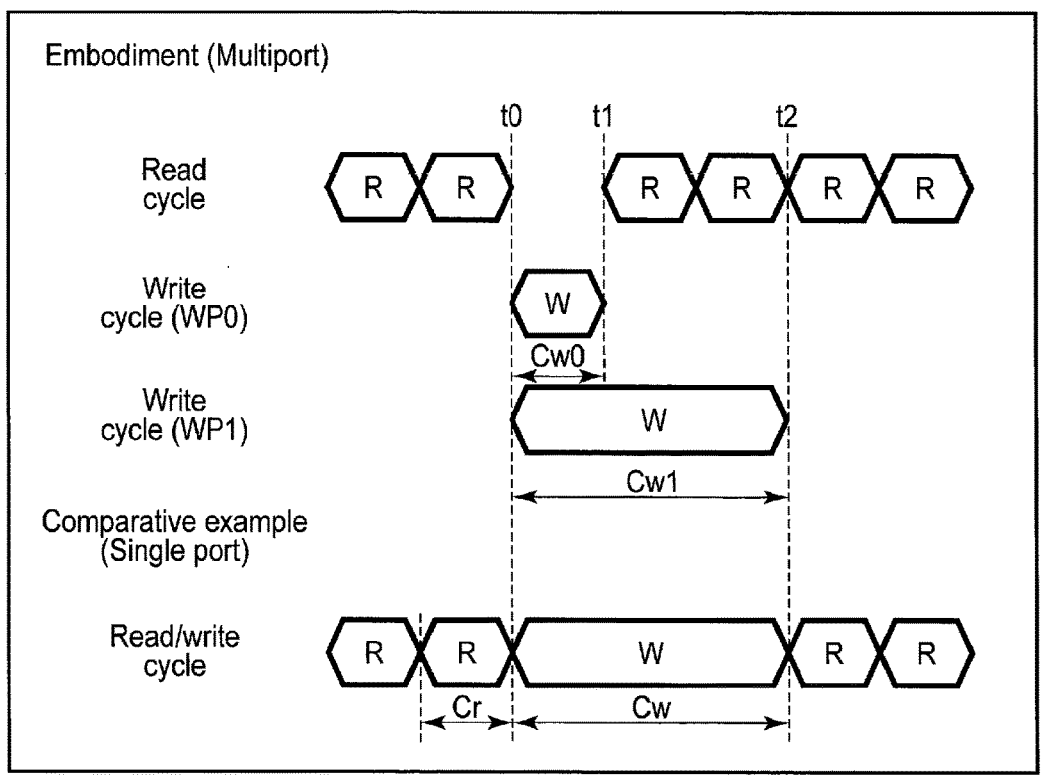
FIG. 6 shows an example of a parallel operation of a read and a write.

For example, as shown in a comparative example (single port) of FIG. 6, in the case where a write cycle Cw is longer than a read cycle Cr, for example, in the case where the read cycle Cr corresponds to one cycle of the clock and the write cycle Cw corresponds to three cycles of the clock, if a write (W) interrupts a read (R), the read (R) cannot be executed while the write (W) is being executed (t0 to t2).

In contrast, as shown in the embodiment (multiport) of FIG. 6, in the case where a read (R) and a write (W) are executed in parallel, for example, even if the write (W) is not complete after a write command is received at the start time t0 of a first cycle, a read command can be received at the start time t1 of a subsequent second cycle.

Here, an example in which a write cycle Cw0 in the case where the write pulse WP0 is used is equal to the read cycle Cr (one cycle of the clock), and a write cycle Cw1 in the case where the write pulse WP1 is used is three times longer than the read cycle Cr (three cycles of the clock) is shown.

In the embodiment of FIG. 6, a write (write cycle Cw1) W in which the write pulse WP1 is used is usually executed. For example, if a write process occurs frequently and a write buffer is filled with write data, that is, if there is a fear that a stall phenomenon occurs even in the multiport, a write (write cycle Cw0) W in which the write pulse WP0 is used can be executed.

The timing of FIG. 6 is premised on the case where the command processing portion 12 is not capable of receiving a read command and a write command at the same time. However, instead, the command processing portion 12 may be capable of receiving a read command and a write command at the same time.

The write buffer 13 functions as a buffer of write data (input data) Din, and temporarily stores write data. The write buffer 13 accumulates a write address AW and the write data Din. The write buffer 13 outputs a write address AWA to the word line decoder 17-0 and the bit line decoder 19-0 sequentially, and outputs write data WD to the write circuit 16-0 sequentially. The address processing portion 14 functions as a buffer of a write address AW and a read address AR. The output selector 15 outputs read data (output data) Dout.

In the multiport nonvolatile RAM 11, a read and a write are executed in parallel. In this case, it is necessary to consider a process performed when a read and a write are executed for the same address (the same memory cell). This is because when a read and a write are executed for the same address in parallel, read data and write data collides and a normal operation cannot be performed.

To prevent this, in the present embodiment, a process performed when the command processing portion 12 receives a read command is devised. For example, when the command processing portion 12 receives a read command, the address processing portion 14 compares a read address AR with a write address AW accumulated in the write buffer 13, and if both of them match, performs a process for acquiring read data RDB from the write buffer 13 without executing a normal read operation (reading data from a memory cell).

In addition, if a read command and a write command can be received at the same time, the read address AR and the write address AW may be compared.

For example, as shown in FIG. 7, the address processing portion 14 comprises address buffers ADB, a comparison circuit 23, an inverter circuit 24, and an AND circuit 25.

The comparison circuit 23 compares a read address AR and a write address AW upon receipt of a read enable signal RE from the command processing portion 12. If both of them match, the comparison circuit 23, for example, outputs 1 (active) as a coincidence signal (output signal) WBO. The fact that the coincidence signal WBO is 1 means acquiring read data RDB from the write buffer 13.

At this time, an output signal of the inverter circuit 24 is 0. Therefore, an output signal of the AND circuit 25 is 0, and a read enable signal RE' supplied to the read circuit 16-1 is 0 (nonactive) regardless of the read enable signal RE. Accordingly, the read circuit 16-1 does not execute a normal read operation.

On the other hand, if the read address AR and the write address AW do not match, the comparison circuit 23, for example, outputs 0 (nonactive) as a coincidence signal (output signal) WBO. The fact that the coincidence signal WBO is 0 means reading read data RD from a memory cell in the multiport memory cell array 22.

At this time, an output signal of the inverter circuit 24 is 1. In addition, an output signal of the AND circuit 25 is 1. Therefore, the read enable signal RE is output to the read circuit 16-1 as it is as a read enable signal RE'. That is, if the read enable signal RE is 1 (active), the read enable signal RE' is also 1 (active). Accordingly, the read circuit 16-1 executes a normal read operation.

The read address AR and the coincidence signal WBO are input to the write buffer 13. The write buffer 13 has the function of outputting write data Din corresponding to the write address AW matching the read address AR to the output selector 15 as read data RDB when the coincidence signal WBO is 1. Such a function can be achieved by, for example, a content addressable memory (CAM).

The write buffer 13, for example, comprises a control portion 27 and a memory portion 26 as shown in FIG. 8. The control portion 27 outputs an access signal φac on the basis of the coincidence signal WBO and the read address AR. The access signal φac is an access signal for reading write data Din corresponding to the write address AW matching the read address AR from the memory portion 26.

Figure 9:
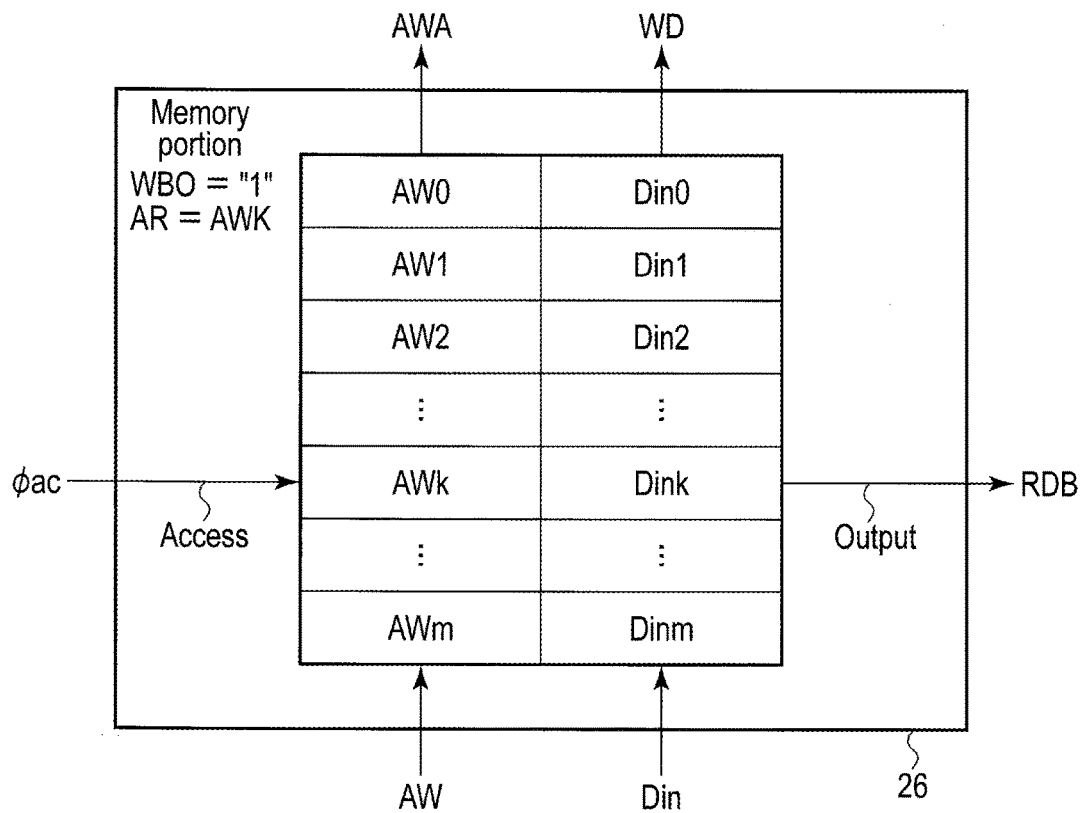
FIG. 9 shows an example of a memory portion in the write buffer.

For example, as shown in FIG. 9, the memory portion 26 comprises entries so that write addresses AW and write data Din can be sequentially accumulated. The figure shows an example in which the write addresses AW are chronologically accumulated in the order of AW0, AW1, AW2, . . . , AWm, and the write data Din is similarly accumulated in the order of Din0, Din1, Din2, . . . , Dinm. In this case, write addresses AWA and write data WD are also output in this order.

Here, upon receipt of an access signal φac, the memory portion 26 searches for a write address AW matching a read address AR, and outputs write data Din corresponding to the write address AW matching the read address AR. For example, if the write address matching the read address AR is a write address AWk, the memory portion 26 outputs write data Dink corresponding to the write address AWk as read data RDB.

The read data RDB is transferred to the output selector 15.

Figure 10:
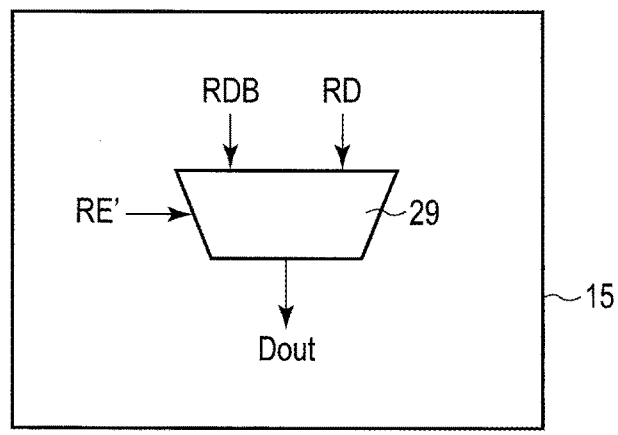
FIG. 10 shows an example of an output selector.

The output selector 15, for example, comprises a selection circuit (multiplexer) 29 as shown in FIG. 10. The selection circuit 29 outputs one of read data RD from the read circuit 16-1 and read data RDB from the write buffer 13 as read data (output data) Dout on the basis of a read enable signal RE' as a select signal.

That is, if the read enable signal RE' is 1, the read circuit 16-1 executes a normal read operation. Therefore, the output selector 15 outputs the read data RD from the read circuit 16-1 as the read data Dout. On the other hand, if the read enable signal RE' is 0, it means that the read data RDB is output from the write buffer 13. Accordingly, the output selector 15 outputs the read data RDB from the write buffer 13 as the read data Dout.

In FIG. 10, one of the read data RD and the read data RDB is selected on the basis of the read enable signal RE'. However, instead, one of the read data RD and the read data RDB can be selected on the basis of a coincidence signal WBO. In this case, it suffices that an inversion signal of the coincidence signal WBO is input to the selection circuit 29 instead of the read enable signal RE'.

An example of the multiport memory cell array 22 will be described.

For example, as shown in FIG. 11, the multiport memory cell array 22 comprises memory cells MC0, . . . , MCi, word lines WL00, . . . , WL0i for writing, bit lines BL0 and bBL0 for writing, word lines WL10, . . . , WL1i for reading, and bit lines BL1 and bBL1 for reading.

The word lines WL00, . . . , WL0i are driven by the word line driver 18-0, and the bit lines BL0 and bBL0 are driven by the bit line driver 20-0. The word lines WL10, . . . , WL1i are driven by the word line driver 18-1, and the bit lines BL1 and bBL1 are connected to the bit line driver 20-1. The bit line driver 20-1, for example, comprises a sense amplifier which determines the value of read data.

Each of the memory cells MC0, . . . , MCi comprises four select transistors (field-effect transistors [FETs]) and a memory element (for example, a magnetoresistive element).

For example, the memory cell MC0 comprises a memory element RE0, a select transistor T00 between the memory element RE0 and the bit line BL0, a select transistor bT00 between the memory element RE0 and the bit line bBL0, a select transistor T01 between the memory element RE0 and the bit line BL1, and a select transistor bT01 between the memory element RE0 and the bit line bBL1.

One of the two select transistors T00 and bT00 can be omitted. In addition, one of the two select transistors 101 and bT01 can be omitted.

In this manner, a collision between read data and write data can be prevented by completely separating a route of read data and a route of write data.

Figure 12:
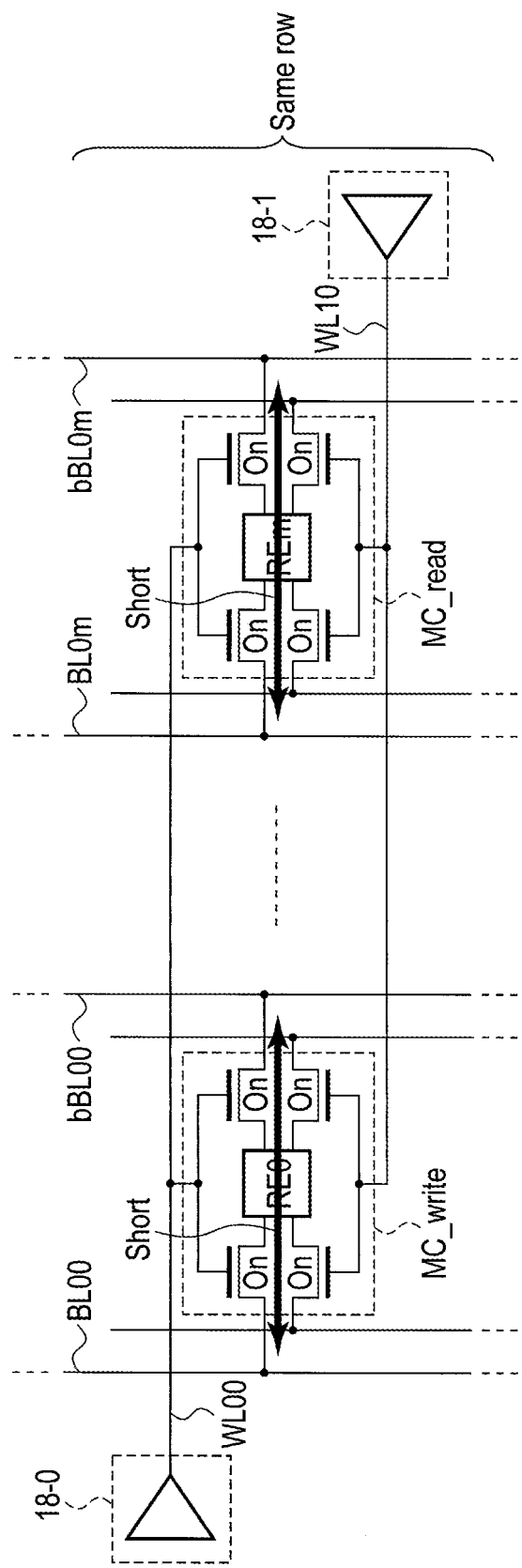
FIG. 12 shows the case where a read/a write is executed from/to two memory cells in the same row.

However, for example, as shown in FIG. 12, if a memory cell MC_write to be a write target and a memory cell MC_read to be a read target are disposed in the same row, read data and write data collides with each other, that is, the two memory cells MC_write and MC_read are electrically short-circuited. Accordingly, devices are required.

Thus, in such a case, for example, a write is temporarily stopped. Then, the write is executed after a read is complete. As a matter of course, the read may be temporarily stopped instead.

Whether the memory cell MC_write to be a write target and the memory cell MC_read to be a read target are disposed in the same row or not can be determined based on whether a read row address of a read address ARA matches a write row address of a write address AWA or not.

If both of them match, for example, the interface portion 11a of FIG. 4 temporarily stops a write. However, this excludes the case where a read address completely matches a write address (the case where both of row addresses and column addresses match).

This is because if the read address completely matches the write address, it is unnecessary to temporarily stop a write, since read data can be acquired from the write buffer as described above. That is, a write operation can be executed in parallel with an operation in which read data is output from the write buffer.

(Divided Word Line Structure)

The present embodiment is compatible with a divided word line structure. The divided word line structure is a memory cell array structure comprising a global first word line, local second word lines connected to the first word line in common, decoders which are allowed to access the local second word lines independently of each other.

Figure 13:
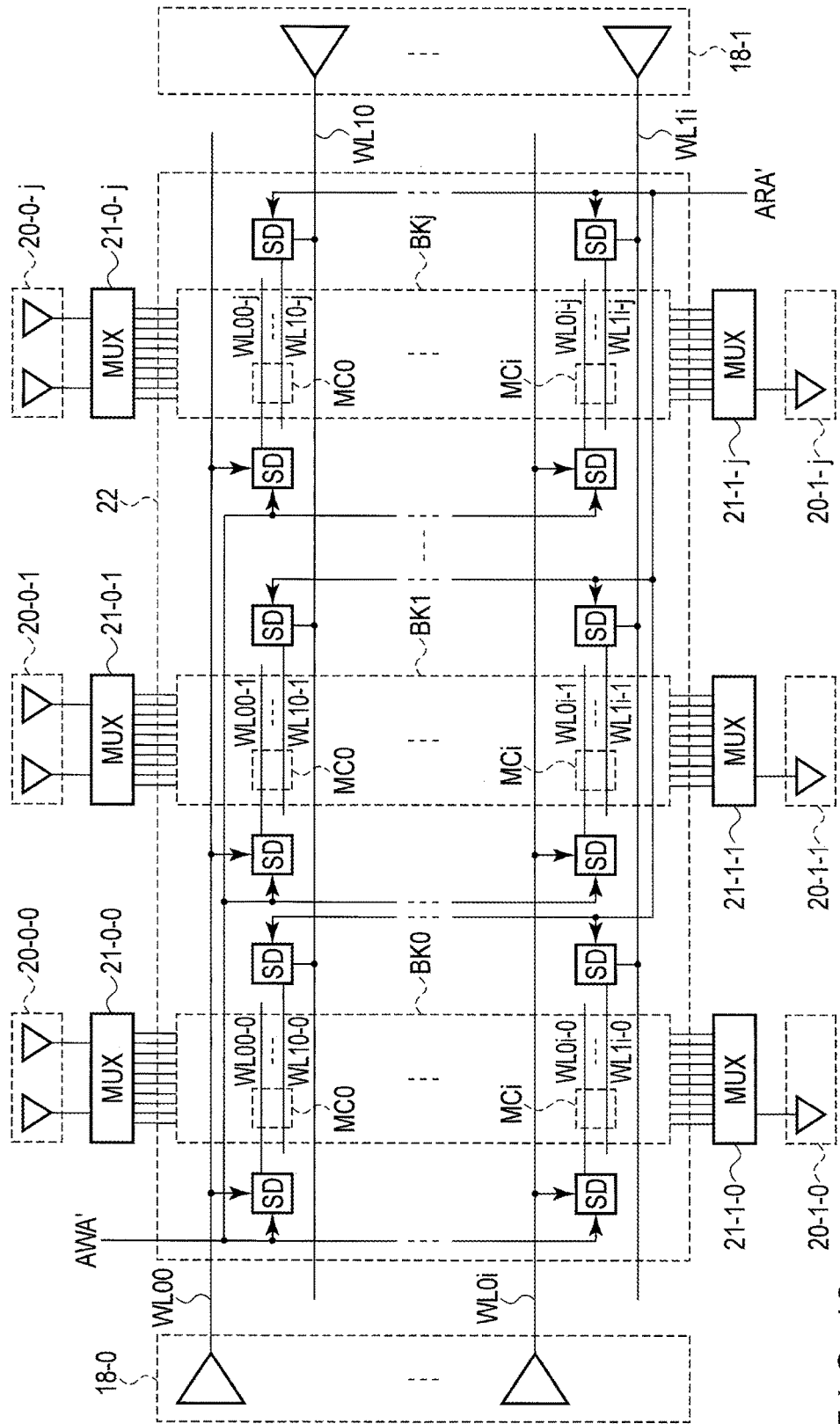
FIG. 13 shows a first example of a divided word line structure.

FIG. 13 shows a first example of the divided word line structure.

The memory cell array 22 comprises blocks BK0, BK1, ..., BKj. The global word lines WL00 to WL0$i$ are provided in the blocks BK0, BK1, ..., BKj in common, and driven by the word line driver 18-0 for writing.

The blocks BK0, BK1, ..., BKj comprise local word lines WL00-0, WL00-1, ..., WL00-$j$, and WL0$i$-0, WL0$i$-1, ..., WL0$i$-$j$, respectively. The global word lines WL00 to WL0$i$ are connected to the local word lines WL00-0, WL00-1, ..., WL00-$j$, and WL0$i$-0, WL0$i$-1, ..., WL0$i$-$j$ via sub-decoders SD.

The sub-decoders SD, for example, can access the local word lines WL00-0, WL00-1, ..., WL00-$j$, and WL0$i$-0, WL0$i$-1, ..., WL0$i$-$j$ independently of each other on the basis of a part of a write address (a part of a column address) AWA'.

Similarly, the global word lines WL10 to WL1$i$ are provided in the blocks BK0, BK1, ..., BKj in common, and driven by the word line driver 18-1 for reading.

The blocks BK0, BK1, ..., BKj comprise local word lines WL10-0, WL10-1, ..., WL10-$j$, and WL1$i$-0, WL1$i$-1, ..., WL1$i$-$j$, respectively. The global word lines WL10 to WL1$i$ are connected to the local word lines WL10-0, WL10-1, ..., WL10-$j$, and WL1$i$-0, WL1$i$-1, ..., WL1$i$-$j$ via sub-decoders SD.

The sub-decoders SD, for example, can access the local word lines WL10-0, WL10-1, ..., WL10-$j$, and WL1$i$-0, WL1$i$-1, ..., WL1$i$-$j$ independently of each other on the basis of a part of a read address (a part of a column address) ARA'.

The structures of the memory cells MC0, ..., MCi (including the structures of bit lines) are, for example, the same as in the example of FIG. 11.

According to the above-described divided word line structure, a write and a read can be completely executed in parallel, provided that a block comprising a memory cell to be a write target and a block comprising a memory cell to be a read target are different. That is, read data and write data do not collide with each other in the same bit line, and thus, a read access operation and a write access operation can be executed at the same time.

Figure 14:
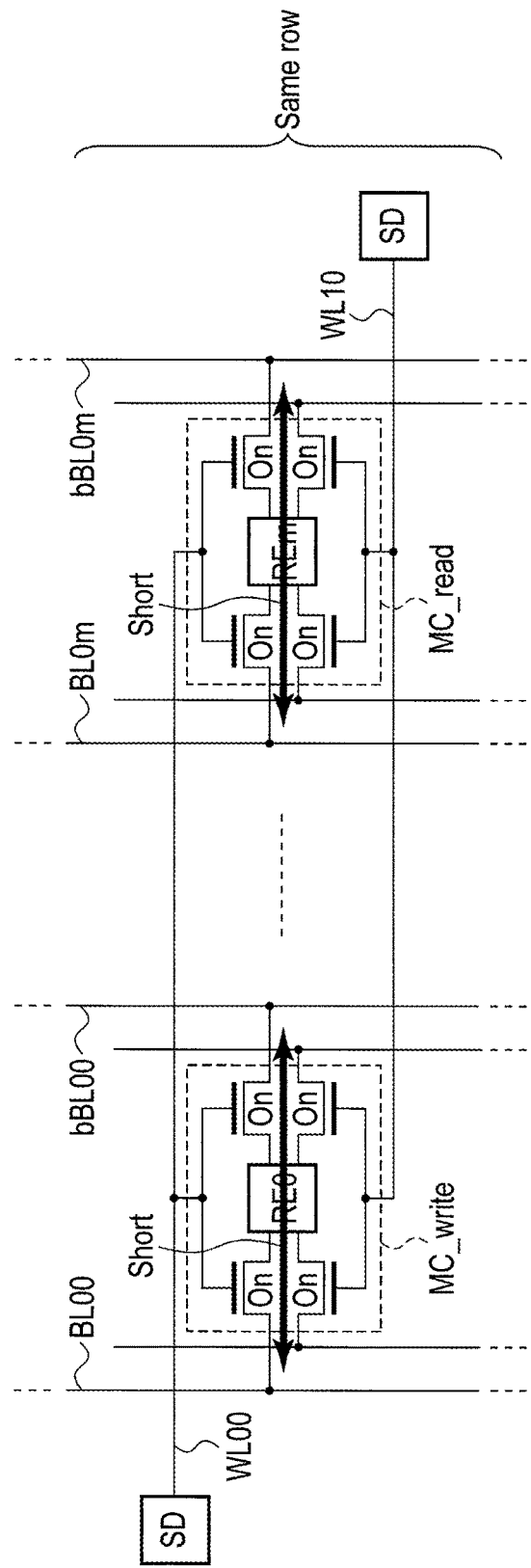
FIG. 14 shows the case where a read/a write is executed from/to two memory cells in the same row.

However, for example, as shown in FIG. 14, if a memory cell MC_write to be a write target and a memory cell MC_read to be a read target are disposed in the same row, read data and write data collide with each other, that is, the two memory cells MC_write and MC_read are electrically short-circuited. Accordingly, devices are required.

Thus, in such a case, for example, a write is temporarily stopped. Then, the write is executed after a read is complete. As a matter of course, the read may be temporarily stopped instead.

Whether the memory cell MC_write to be a write target and the memory cell MC_read to be a read target are disposed in the same row or not can be determined based on, for example, whether an address ARA' selecting the local word lines WL10-0, WL10-1, ..., WL10-$j$, and WL1$i$-0, WL1$i$-1, ..., WL1$i$-$j$ of FIG. 13 matches an address AWA' selecting the local word lines WL00-0, WL00-1, ..., WL00-$j$, and WL0$i$-0, WL0$i$-1, ..., WL0$i$-$j$ or not.

If both of them match, for example, the interface portion 11a of FIG. 4 temporarily stops a write. However, this excludes the case where a read address completely matches a write address. This is because if the read address completely matches the write address, it is unnecessary to temporarily stop a write, since read data can be acquired from the write buffer. That is, a write operation can be executed in parallel with an operation in which read data is output from the write buffer.

Figure 15:
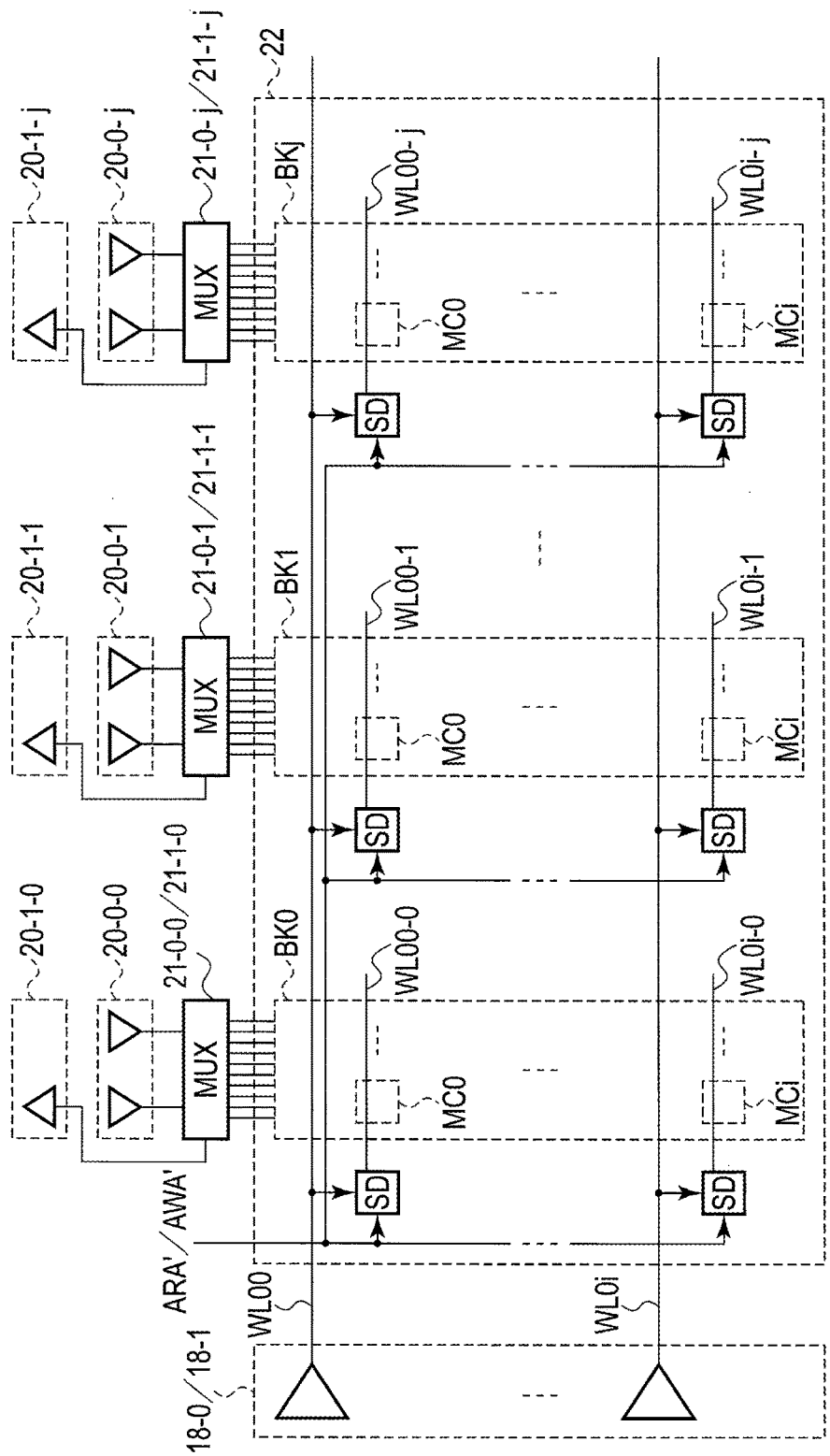
FIG. 15 shows a second example of the divided word line structure.

FIG. 15 shows a second example of the divided word line structure.

As compared to the first example, the second example is characterized in that the word line driver 18-0 for writing and the word line driver 18-1 for reading are integrated.

Accordingly, for example, the global word lines WL10 to WL1$i$, the local word lines WL10-0, WL10-1, ..., WL10-$j$, and WL1$i$-0, WL1$i$-1, ..., WL1$i$-$j$ and the sub-decoders SD connected therebetween of FIG. 13 can be omitted.

Also in this case, as in the first example, a write and a read can be completely executed in parallel, provided that a block comprising a memory cell to be a write target and a block comprising a memory cell to be a read target are different. In addition, if the block comprising the memory cell to be a write target and the block comprising the memory cell to be a read target are the same, for example, a write can be temporarily stopped.

In the divided word line structure according to the second example, the memory cells MC0, ..., MCi, for example, can have a one-transistor one-element structure comprising one select transistor and one memory element RE as shown in FIG. 16. Thus, in the second example, the size of the memory cells MC0, ..., MCi can be reduced as compared to that in the first example. That is, a contribution can be made to an increase in the memory capacity of the nonvolatile RAM 11.

Figure 17:
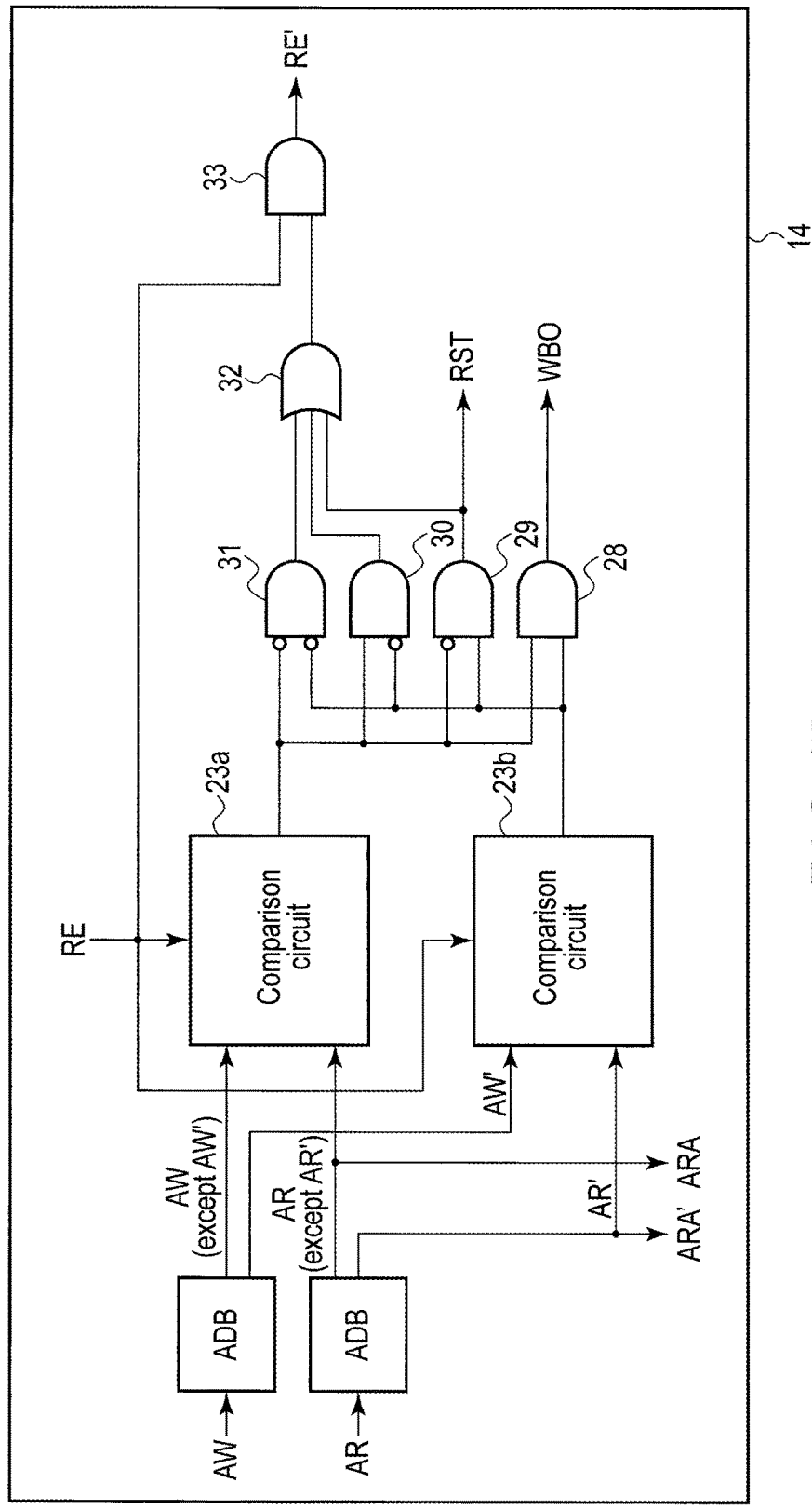
FIG. 17 shows an example of the address processing portion.

FIG. 17 shows an example of an address processing portion.

The address processing portion 14 comprises address buffers ADB, comparison circuits 23a and 23b, AND circuits 28, 29, 30, 31, and 33, and an OR circuit 32.

The comparison circuit 23a compares a read address AR (except AR') and a write address AW (except AW') upon receipt of a read enable signal RE from the command processing portion 12. The comparison circuit 23b compares a read address AR' and a write address AW' upon receipt of a read enable signal RE from the command processing portion 12.

The read address AR and the write address AW correspond to a read address ARA and a write address AWA. The read address AR' and the write address AW' are addresses (bits) selecting the local word lines WL00-0, WL00-1, . . . , WL00-j, and WL0i-0, WL0i-1, . . . , WL0i-j, and correspond to a read address ARA' and a write address AWA'.

If the read address AR and the write address AW completely match, the comparison circuits 23a and 23b both output 1. Accordingly, the AND circuit 28 outputs, for example, 1 (active) as a coincidence signal (output signal) WBO. The fact that the coincidence signal WBO is 1 means acquiring read data RDB from the write buffer 13.

At this time, output signals of the AND circuits 29, 30, and 31 are all 0, and thus, an output signal of the OR circuit 32 is 0. Therefore, an output signal of the AND circuit 33 is 0, and a read enable signal RE' supplied to the read circuit 16-1 is 0 (nonactive) regardless of a read enable signal RE. Accordingly, the read circuit 16-1 does not execute a normal read operation.

In addition, the comparison circuit 23a outputs 0 and the comparison circuit 23b outputs 1, if the address (bit) AR' selecting the local word lines WL00-0, WL00-1, . . . , WL00-j, and WL0i-0, WL0i-1, . . . , WL0i-j of the read address AR, and the address (bit) AW' selecting the local word lines WL00-0, WL00-1, . . . , WL00-j, and WL0i-0, WL0i-1, . . . , WL0i-j of the write address AW match (except the case where the addresses AR and AW completely match).

Accordingly, the AND circuit 28 outputs, for example, 0 (nonactive) as a coincidence signal (output signal) WBO. The fact that the coincidence signal WBO is 0 means acquiring read data RD from the memory cell array 22.

In addition, the AND circuit 29 outputs, for example, 1 (active) as a stop signal (output signal) RST. The fact that the stop signal RST is 1 means temporarily stopping a write. For example, the command processing portion 12 comprises a WE control portion 34 as shown in FIG. 18. The WE control portion 34, for example, comprises an AND circuit 34 as shown in FIG. 19.

The WE control portion 34 forcibly sets a write enable signal WE to 0, if the stop signal RST is 1. That is, a write is temporarily stopped. In addition, the WE control portion 34 outputs the write enable signal WE as it is, if the stop signal RST is 0.

Moreover, an output signal of the AND circuit 29 is 1, and thus, an output signal of the OR circuit 32 is 1. Therefore, an output signal of the AND circuit 33 is 1, and a read enable signal RE (=1) is supplied to the read circuit 16-1 as a read enable signal RE'. Accordingly, the read circuit 16-1 executes a normal read operation.

In the other cases, that is, the case where the read address AR (except AR') and the write address AW (except AW') match and the read address AR' and the write address AW' do not match, and the case where the read address AR (except AR') and the write address AW (except AW') do not match and the read address AR' and the write address AW' do not match either, the coincidence signal WBO and the stop signal RST are both 0.

In addition, one of the AND circuits 30 and 31 is 1, and thus, an output signal of the OR circuit 33 is 1. Therefore, the read enable signal RE is output to the read circuit 16-1 as it is as the read enable signal RE'. That is, if the read enable signal RE is 1 (active), the read enable signal RE' is also 1 (active). Accordingly, a parallel operation of a read and a write is enabled.

CONCLUSION

As described above, according to the present embodiment, a nonvolatile RAM of a high speed and high endurance can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A nonvolatile RAM comprising:
a memory cell array;
a first circuit being allowed to access the memory cell array in a write operation using a first pulse;
a second circuit being allowed to access the memory cell array in a read operation using a second pulse, the second circuit being allowed to operate in parallel with an operation of the first circuit; and
a write circuit selectively outputting one of a third pulse and a fourth pulse as the first pulse on the basis of a select signal,
wherein a width of the first pulse is longer than a width of the second pulse.
2. The nonvolatile RAM of claim 1, further comprising an interface portion including a write buffer storing a write address and write data in the write operation, and being capable of outputting the write data in the write buffer as read data.
3. The nonvolatile RAM of claim 2, wherein the interface portion includes an address processing portion outputting a signal showing that a read address is coincident with the write address in the write buffer in the read operation.
4. The nonvolatile RAM of claim 3, wherein the address processing portion inhibits access to the memory cell array using the second circuit on the basis of the signal.
5. The nonvolatile RAM of claim 3, wherein the write buffer outputs the write data as the read data on the basis of the signal in the read operation.
6. The nonvolatile RAM of claim 5, wherein the write buffer is a content addressable memory.
7. The nonvolatile RAM of claim 5, wherein the interface portion includes a selector selectively outputting read data from the memory cell array or the read data from the write buffer.
8. The nonvolatile RAM of claim 2, wherein the interface portion includes an address processing portion outputting a signal showing that a read address is different from the write address in the write buffer in the read operation.

9. The nonvolatile RAM of claim 8, wherein the address processing portion allows access to the memory cell array using the second circuit on the basis of the signal.

10. The nonvolatile RAM of claim 9, further comprising a read circuit reading the read data from the memory cell array.

11. The nonvolatile RAM of claim 10, wherein the interface portion includes a selector selectively outputting the read data from the read circuit or the read data from the write buffer.

12. The nonvolatile RAM of claim 1, wherein the memory cell array comprises:
blocks;
a first word line common to the blocks;
second word lines corresponding to the blocks; and
decoders electrically connected between the first word line and the second word lines.

13. The nonvolatile RAM of claim 1, wherein the first and second circuits do not operate in parallel, when a first memory cell in the memory cell array to be accessed by the first circuit and a second memory cell in the memory cell array to be accessed by the second circuit are disposed in the same row and are not the same memory cell.

14. The nonvolatile RAM of claim 13, wherein
access to the first memory cell using the first circuit is inhibited and
access to the second memory cell using the second circuit is allowed, when the first and second memory cells are disposed in the same row and are not the same memory cell.

15. The nonvolatile RAM of claim 13, wherein access to the first memory cell using the first circuit is allowed and access to the second memory cell using the second circuit is inhibited, when the first and second memory cells are disposed in the same row and are not the same memory cell.

16. The nonvolatile RAM of claim 1, wherein the first and second circuits operate in parallel, when a first memory cell in the memory cell array to be accessed by the first circuit and a second memory cell in the memory cell array to be accessed by the second circuit are the same memory cell.

17. The nonvolatile RAM of claim 1, wherein the third pulse has a first voltage and a first width, and the fourth pulse has a second voltage lower than the first voltage and a second width longer than the first width.

18. The nonvolatile RAM of claim 1, further comprising a command processing portion outputting the select signal on the basis of a command in the write operation.

19. A system comprising:
the nonvolatile RAM of claim 18; and
a control portion controlling the nonvolatile RAM,
wherein the control portion issues the command on the basis of whether a speedup is required of the nonvolatile RAM.

* * * * *